United States Patent [19]

Walton

[11] Patent Number: 5,025,227

[45] Date of Patent: Jun. 18, 1991

[54] METAL DETECTION CIRCUIT

[75] Inventor: Richard J. Walton, Johannesburg, South Africa

[73] Assignee: William Young, Sandton, Transvaal, South Africa

[21] Appl. No.: 420,036

[22] Filed: Oct. 11, 1989

[30] Foreign Application Priority Data

Oct. 11, 1988 [ZA] South Africa ................ 88/7568

[51] Int. Cl.⁵ ............................................. G01N 27/00
[52] U.S. Cl. ........................................ 331/65; 331/18
[58] Field of Search ................ 331/18, 65; 324/207, 324/236, 237, 327; 361/180; 340/568, 941

[56] References Cited

U.S. PATENT DOCUMENTS 4,639,689  1/1987  Bartlett .................................. 331/65
4,825,158  4/1989  Watabe et al. ..................... 331/65 X Primary Examiner—David Mis
Attorney, Agent, or Firm—Cushman, Darby & Cushman

[57] ABSTRACT

Metal detection apparatus comprises an oscillator circuit including an inductive detection coil and a detector for rectifying the output of the oscillator circuit synchronously with the frequency of oscillation. A comparison circuit compares the rectified output of the oscillator circuit with a reference signal and generates an output signal having a value related to the amplitude of the oscillator output. A feedback circuit generates a positive feedback signal and applies it to the oscillator circuit to maintain its oscillation at a predetermined amplitude under quiescent conditions. The circuit is largely immune to electromagnetic interference and temperature sensitive effects.

5 Claims, 2 Drawing Sheets

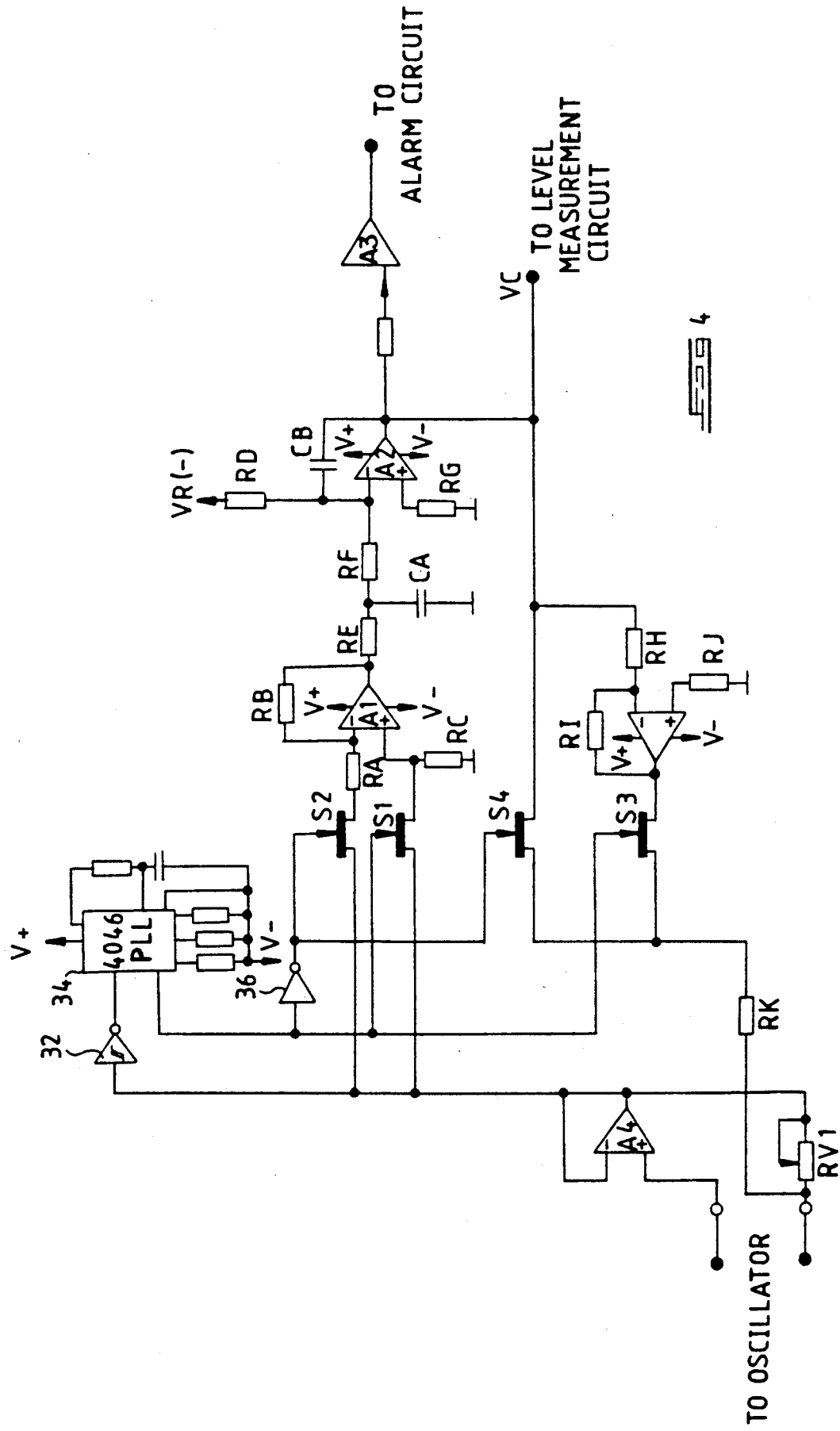

METAL DETECTION CIRCUIT

BACKGROUND OF THE INVENTION

This invention relates to metal detection apparatus.

Numerous metal detection circuits have been proposed. Most such circuits employ an oscillator circuit including an inductive detection coil. The presence of metal near the coil alters the parameters of the oscillating circuit, and the resulting variation in the output of the oscillating circuit is detected. Circuits of the kind described are sensitive to various electromagnetic signals, including radio frequency and mains-borne disturbances. Such circuits are also frequently highly sensitive to temperature variations and to variations in component values. This may result in unsatisfactory performance, or may necessitate the use of complex and expensive compensating circuitry, and the selection of expensive, high quality components.

It is an object of the invention to provide a metal detection circuit which is relatively insensitive to temperature variations and to electromagnetic interference.

SUMMARY OF THE INVENTION

According to the invention there is provided metal detection apparatus comprising:

a detection coil;

an oscillator circuit including the detection coil;

detector means for rectifying the output of the oscillator circuit synchronously with the frequency of oscillation;

comparison means for comparing the rectified output of the oscillator circuit with a reference signal and for generating an output signal having a value related to the amplitude of the output of the oscillator circuit; and feedback means for generating a positive feedback signal and for applying it to the oscillator circuit to maintain oscillation thereof at a predetermined amplitude under quiescent conditions.

BRIEF DESCRIPTION OF THE DRAWINGS

FIG. 4 shows how the circuits of FIGS. 2 and 3 are interconnected in practice.

DESCRIPTION OF AN EMBODIMENT

Figure 1:
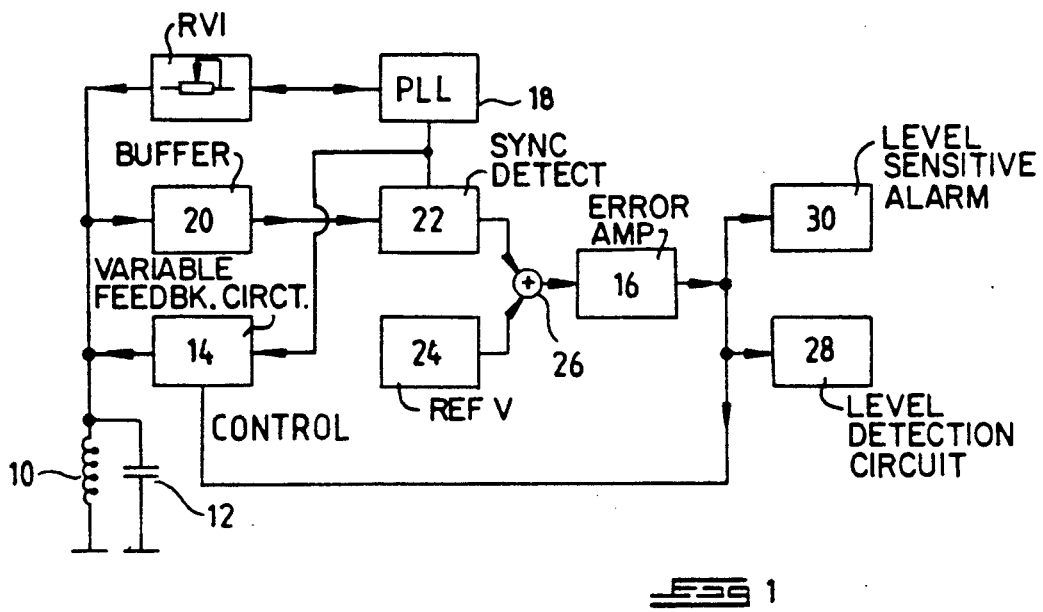
FIG. 1 is a block schematic diagram of metal detection apparatus according to the invention.

In FIG. 1, the general layout of the metal detection apparatus is shown schematically. The apparatus includes an oscillator circuit comprising a detection coil 10 and a parallel capacitor 12. Oscillation of the oscillator circuit is stimulated and controlled by a variable feedback circuit 14 which applies a feedback signal having an amplitude which is determined by the output of an error amplifier 16 and a frequency which is determined by the output of a phase locked loop 18. The phase locked loop 18 is fed with the output of the oscillator circuit via a buffer 20 and its output is fed to a synchronised detector circuit 22 which rectifies the output of the oscillator circuit and applies it, together with a reference voltage from a reference voltage source 24, to a summing point 26 of the error amplifier 16.

The output of the error amplifier is a DC voltage which is proportional to the amplitude of the oscillator circuit output, but which is largely independent of temperature and electromagnetic interference, due to characteristics of the circuit which will be described in more detail below. The output of the error amplifier 16 is fed to conventional level detection circuits 28 and/or to level sensitive alarm circuits 30, which provide an indication to a user of the apparatus of the presence of a metallic object. Such level detection and alarm circuits are conventional and are not described further.

Figure 2:
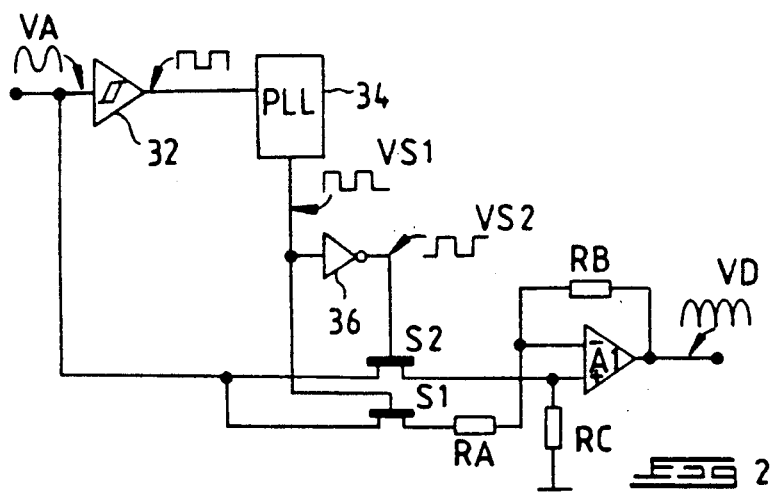
FIG. 2 is a schematic circuit diagram of a detector circuit of the apparatus of FIG. 1.

The operation of the circuitry will now be described in greater detail, with reference to FIGS. 2, 3 and 4. In FIG. 2, the output of the oscillator circuit, which is sinusoidal, is fed to the input of a detector circuit comprising a zero crossing squarer 32, a phase locked loop 34 (typically a type 4046 CMOS device) an inverter 36, a pair of FET switches $S_1$ and $S_2$, and a first amplifier $A_1$. The output of the oscillator circuit $V_A$ is processed by the zero crossing squarer 32, which provides a square wave output having the same frequency as the oscillator output frequency. This output is fed to the phase locked loop 34, which tracks the oscillator output frequency and produces a first switch control signal $V_{S1}$. The output of the phase locked loop is inverted by the inverter 36 to produce a second switch control signal $V_{S2}$. These switch control signals are fed to the gates of the respective switches $S_1$ and $S_2$, switching them on and off synchronously with the output of the oscillator circuit. The switches $S_1$ and $S_2$ are connected to the inverting and non-inverting inputs of the amplifier $A_1$, respectively, so that the output of the amplifier $A_1$ is a rectified version of the oscillator output, designated $V_D$.

Figure 3:
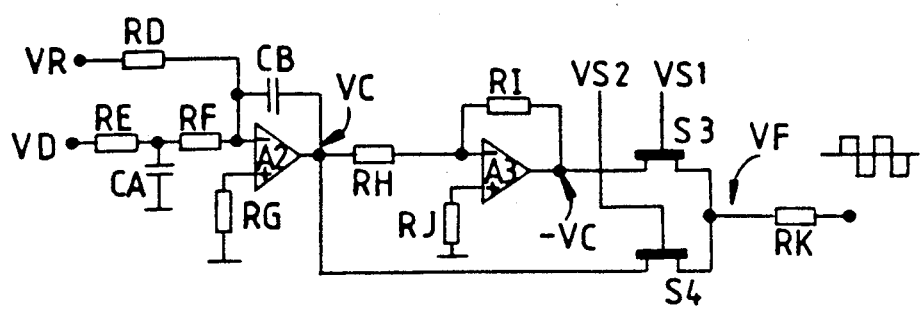
FIG. 3 is a schematic circuit diagram of a comparison and feedback circuit of the apparatus of FIG. 1.

In FIG. 3, the output $V_D$ of the amplifier $A_1$ is fed by a smoothing network comprising two resistors $R_E$ and $R_F$ and a capacitor $C_A$ to a summing point at the inverting input of a second amplifier $A_2$. (This corresponds to the summing point 26 in FIG. 1). A preset reference voltage $V_R$ is fed via a resistor $R_D$ to the same point. The value of the reference voltage is selected so that when the metal detector is in a quiescent condition, the output $V_C$ of the amplifier $A_2$ has a predetermined level. The output of the amplifier $A_2$ is fed via a resistor $R_H$ to a third amplifier $A_3$, which inverts the output voltage $V_C$. The output voltages $V_C$ and $-V_C$ are applied to respective FET switches $S_4$ and $S_3$, which are controlled by the same signals which control the switches $S_1$ and $S_2$, and which produce a feedback signal $V_F$ which is synchronous with the oscillator output and which has a peak amplitude $V_C$. This signal is fed via a resistor $R_K$ as a positive feedback signal to the oscillator circuit.

In FIG. 4 the potentiometer $RV_1$ is pre-adjusted to apply sufficient positive feedback to the oscillator circuit so that a desired working amplitude of the feedback signal $V_F$ is obtained. The feedback signal to the oscillator circuit comprises both the square wave signal $V_F$, which is applied directly, and a sinusoidal component which is applied via the buffer amplifier $A_4$ (20) and the potentiometer $RV_1$. The amplitude of oscillation of the oscillator circuit is also determined by the reference voltage $V_R$. When a metal object is brought into proximity with the oscillator detector coil 10, the closed loop of the circuitry will adjust its parameters to ensure that the amplitude of oscillation remains constant. The resulting change in the control voltage $V_C$ is then processed by the level measurement circuitry 28 or the alarm circuitry 30, in the usual manner, to provide a useful output to an operator of the apparatus. The change in the value of $V_C$ is independent of the rate of intrusion of a metal object into the detection zone of the coil 10, so that if a metal object were to be placed within the detection zone and left there, a given change in the value of the voltage $V_C$ would occur and would remain constant. This is a useful characteristic, allowing relative changes in the value of the voltage $V_C$ to be used for measurement purposes, rather than its absolute value, which will depend on factors such as the setting of the potentiometer $RV_1$ and any secondary metal intrusion into the detection zone.

The use of the phase locked loop 34 renders the detection circuitry largely immune to electromagnetic interference, and the design of the comparison and feedback circuitry results in a circuit which is not dependent on the characteristics of highly temperature-sensitive components as far as the accuracy of its output is concerned.

I claim:

1. Metal detection apparatus comprising:
   an oscillator circuit including a detection coil
   detector means for rectifying an output of the oscillator circuit synchronously with a frequency of oscillation thereof;
   comparison means for comparing a rectified output of the oscillator circuit from the detector means with a reference signal and for generating an output signal having a value related to an amplitude of the output of the oscillator circuit; and
   positive feedback means for generating a positive feedback signal and for applying it to the oscillator circuit to maintain oscillation thereof at a predetermined amplitude under quiescent conditions.

2. Apparatus according to claim 1 wherein the detector means includes a phase locked loop which generates a control signal locked to the output frequency of the oscillator circuit, a first amplifier having inverting and non-inverting inputs, and switch means responsive to the control signal to apply the output of the oscillator circuit alternatively to the inverting and non-inverting inputs of the first amplifier, so that the first amplifier output is a full-wave rectified version of the oscillator output.

3. Apparatus according to claim 2 wherein the output of the first amplifier is applied to the input of the comparison means together with said reference signal, the value of the reference signal being selected so that the output signal of the comparison means has a predetermined value under quiescent conditions.

4. Apparatus according to claim 3 wherein the comparison means comprises second and third amplifiers, the second amplifier being arranged to generate the output signal of the comparison means and the third amplifier being arranged to invert that output signal.

5. Apparatus according to claim 4 wherein the outputs of the second and third amplifiers are applied to respective switches which are controlled by the output of the phase locked loop to generate a feedback signal which is synchronous with the output of the oscillator circuit and having a peak amplitude equal to the level of the output signals of the second and third amplifiers.

* * * * *